US006850398B2

(12) United States Patent
Ciancio

(10) Patent No.: US 6,850,398 B2
(45) Date of Patent: Feb. 1, 2005

(54) FEED FORWARD PROGRAMMABLE CURRENT CONTROLLER

(75) Inventor: Giuseppe M. Ciancio, Tokyo (JP)

(73) Assignee: Xicor, Inc., Milpitas, CA (US)

( * ) Notice: Subject to any disclaimer, the term of this patent is extended or adjusted under 35 U.S.C. 154(b) by 239 days.

(21) Appl. No.: 09/877,291

(22) Filed: Jun. 7, 2001

(65) Prior Publication Data

US 2002/0196595 A1 Dec. 26, 2002

(51) Int. Cl.[7] .................................................. H02H 3/08
(52) U.S. Cl. ..................................................... 361/93.1
(58) Field of Search .............................. 361/93.1, 93.2, 361/93.8, 93.9, 103

(56) References Cited

U.S. PATENT DOCUMENTS

| | | | |
|---|---|---|---|
| 5,019,769 A | 5/1991 | Levinson | |
| 5,073,838 A | * 12/1991 | Ames | 361/103 |
| 5,268,800 A | * 12/1993 | Nielsen | 360/77.01 |
| 6,504,350 B2 | * 1/2003 | Leonowich | 323/281 |

OTHER PUBLICATIONS

Dallas Semiconductor, Editor: Patricia Greaves, "First Temperature–Compensated Resistors from Dallas Semiconductor Provide Laser Precision and Safety in Gigabit Optical Transceivers," DS1847 & DS1848 Data Sheet, pp. 1–2, http://www.dalsemi.com/news/pr/product/2000/1847.html, Oct. 16, 2000.

Dallas Semiconductor, "Preliminary DS1848, Dual Temperature–Controlled NV Variable Resistor & Memory," pp. 1–16, www.dalsemi.com, Sep. 28, 2000.

* cited by examiner

*Primary Examiner*—Adolf Berhane
(74) *Attorney, Agent, or Firm*—Townsend and Townsend and Crew LLP

(57) ABSTRACT

An integrated, programmable, feed forward current controller supplies a control current to control or compensate a drive current used to drive a device having a response that depends upon a physical parameter such as temperature. Control current compensation data are stored in a programmable look-up table as a function of the physical parameter. A transducer converts a measurement of the physical parameter into an electrical signal that is digitized and used to address the contents of the look-up table. The compensated control current stored in the look-up table is converted into an analog current and used to control or compensate a drive current used to drive the device under control, thereby minimizing the dependence of the device's response on the physical parameter.

35 Claims, 8 Drawing Sheets

300
Internal Voltage Ref. 350
351 VREF
Select
Internal Temp Sensor 320
321 VSENSE
Select 322
A/D 340
Select 344
343 Select
309 Control & Status
Row Select
310 Look-Up Table 2
311 Look-Up Table 1
Output Decode
312 General Purpose Memory
Select 346
Select 345
D/A1 360
D/A2 361
R1 370
I1 301
R2 371
I2 302
A2
A1
A0
SDA
SCL
WP
Interface 330

FEED FORWARD PROGRAMMABLE CURRENT CONTROLLER

TECHNICAL FIELD

This invention relates to the field of feed forward programmable current controllers.

BACKGROUND

The response of an electronic device is often dependent on external physical parameters such as temperature, pressure, and humidity. For example, as shown in FIG. 1, the output power of a laser diode is a function of both the temperature of the diode, and the input current injected into the diode. At a given temperature, a minimum or threshold current must be supplied to the laser diode to cause it to emit a significant amount of power in the form of laser light. Above the threshold current, the power output of the laser diode is approximately proportional to its input current. This dependence of output power on input or injected current allows information to be modulated onto the power output of the laser diode by modulating the input current used to drive the laser diode.

Modulation of the output power of a laser diode is typically achieved by driving the laser diode with both a bias current 120 and a modulation current 130 as shown in FIG. 1. The combination of the bias 120 and modulation 130 currents establishes an operating range for the laser diode within which the laser light output power 140 is modulated. The operating range includes a minimum light output power level 150 and a maximum light output power level 160. When the modulation current 130 is digitally modulated between low and high current levels, laser light output power 140 is similarly modulated between low 150 and high 160 power levels. The low 150 and high 160 power levels can be used to represent the binary logic levels 0 and 1 in a digital bit stream. Thus, the laser diode can be used to generate and transmit a digital bit stream by driving it with a modulation current 130 that is driven by the same digital bit stream.

It is well known that the power output of a laser diode has a strong temperature dependence. Consequently, the operating range established for a laser diode by a given pair of bias and modulation currents changes as the ambient temperature of the diode changes. For many applications, it is important to maintain the light output power levels of a laser diode within a predetermined operating range. For example, in optical fiber communications it is important to maintain a laser diode's light output power levels within a predetermined operating range so that the system can discriminate between the low and high logic levels corresponding to the laser diode's low 150 and high 160 light output power levels.

To maintain a laser diode's established low 150 and high 160 light output power levels as the diode's temperature changes, the diode's bias and modulation currents must be temperature compensated or adjusted to correct for the dependence of the laser diode's light output power on temperature. For example, as shown in FIG. 1, as the temperature of a laser diode configured to operate at −40° C. between low 150 and high 160 light power output levels changes from −40° C. to +80° C., the diode's bias 120 and modulation 130 currents at −40° C. must be adjusted to temperature compensated bias 121 and modulation 131 currents at +80° C. in order to keep the diode's light output power within its operating range.

SUMMARY

The invention discloses an integrated, programmable, feed forward current controller. The programmable feed forward current controller produces a control current that can be used to control a drive current that is used to drive an electronic device. The programmable feed forward current controller can thereby be used to compensate the electronic device for the dependence of its response on a physical parameter such as temperature.

The programmable feed forward current controller can use an arbitrarily programmable look-up table to program the control current. The arbitrarily programmable look-up table can be pre-programmed with a plurality of control currents corresponding to a respective plurality of values of the physical parameter on which the response of the electronic device depends. A transducer can produce a signal corresponding to a measured value of the physical parameter. The signal can be digitized and used to address an entry in the look-up table. The look-up table entry can be preprogrammed with a digitally stored control current that can be subsequently converted into an analog control current. The analog control current can be used to control a drive current to drive the electronic device and to compensate the device for the dependence of its response on the physical parameter.

In one implementation, the programmable current controller can be configured to control the bias and modulation currents that are used to drive a laser diode in order to compensate the laser diode for the temperature dependence of its light output power levels. In this implementation, a user can predetermine the temperature compensated bias and modulation currents needed to drive the laser diode so that it's light output power levels are maintained at predetermined minimum and maximum power levels regardless of temperature. The control currents required to produce the predetermined temperature compensated bias and modulation currents can then be programmed into a pair of look-up tables from the programmable current controller's command interface.

In operation, the temperature of the laser diode can be measured through an internal or external temperature sensor. The measured temperature can be digitized and added to a respective pair of memory offsets to produce a pair of addresses for the look-up tables. The addresses can be used to respectively address the pair of look-up tables to obtain the control currents necessary to produce temperature compensated bias and modulation currents at the measured temperature. The addressed control currents can be converted into analog currents and used to control the bias and modulation currents that drive the laser diode. The respective rates at which the control currents are updated can be independently programmed to prevent instabilities from arising in the controlled bias and modulation currents.

Aspects of the invention can include one or more of the following: the programmable bias controller can be implemented as a monolithic integrated circuit having a feed forward programmable current supply. A feed forward compensation circuit can be used to drive the feed forward programmable current supply. The current output of the programmable current supply can be updated at a programmable rate. The feed forward compensation circuit can include a programmable look-up table configured to store data used to program the programmable current supply. The programmable look-up table can be made of non-volatile memory elements such as EEPROM memory elements. The programmable bias controller can include means for programming control current compensation data into the programmable look-up table. The programming means can include a digital serial interface. The programmable current controller can include a transducer capable of converting a physical parameter such as a temperature, pressure, flow, intensity, humidity, luminosity, acidity, salinity, resistance, current, voltage, weight, size, or density into an electrical signal. An analog-to-digital converter can convert the electrical signal output by the transducer to a digital signal that can be used to address an entry in the programmable look-up table.

In another aspect, the invention discloses a programmable bias controller implemented as a monolithic integrated circuit having a transducer capable of converting a physical parameter into a digital signal; a programmable look-up table coupled to and addressable by the digital output of the transducer that is configured to store control current data for a programmable current source; and a programmable current source coupled to the programmable look-up table.

In another aspect, the invention discloses a laser diode current controller implemented on a monolithic integrated circuit having a temperature sensing circuit with a digital output; first and second control current look-up tables coupled to and addressable by the digital output of the temperature sensing circuit that are configured to store control current data to control or temperature compensate laser diode bias and modulation currents; and first and second control current sources respectively operable to control the bias and modulation currents used to drive a laser diode.

Implementations of the invention can include one or more of the following: the temperature sensing circuit can be selectably an internal temperature sensing circuit or an external temperature sensing circuit. The temperature sensing circuit can include an analog temperature transducer operable to output an analog signal corresponding to a temperature, and an analog-to-digital converter operable to convert the analog output signal to a digital output signal.

The programmable current controller can further include first and second digital-to-analog converters respectively coupled between the first and second control current look-up tables and the first and second control current sources, and configured to respectively convert the digital outputs of the first and second control current look-up tables into analog outputs to respectively program the first and second control current sources. The update rates of the first and second digital-to-analog converters can be independently programmable. The first and second control current sources can be temperature compensated. The first and second control current look-up tables can comprise non-volatile memory elements such as EEPROM memory elements. The first and second control current look-up tables can be programmable. The programmable current controller can include means for programming the first and second control current look-up tables such as a digital serial interface.

In another aspect, the invention discloses a method for maintaining the power output of a laser diode at a plurality of power levels including measuring the temperature of the laser diode; determining the control currents necessary to temperature compensate the bias and modulation currents used to drive the laser diode; and controlling the bias and modulation currents used to drive the laser diode at the desired power output.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
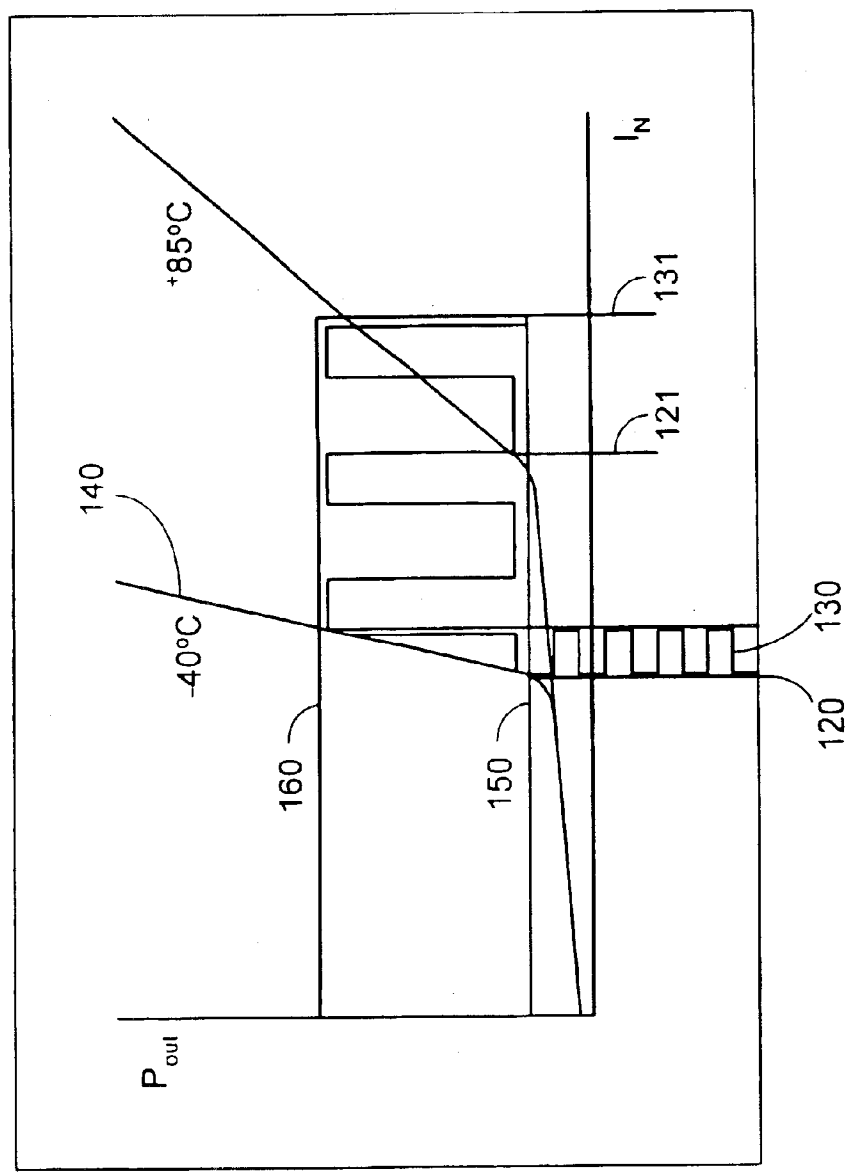
FIG. 1 is a graphical illustration of the light power output of a laser diode as a function of injected current and temperature.
Figure 2:
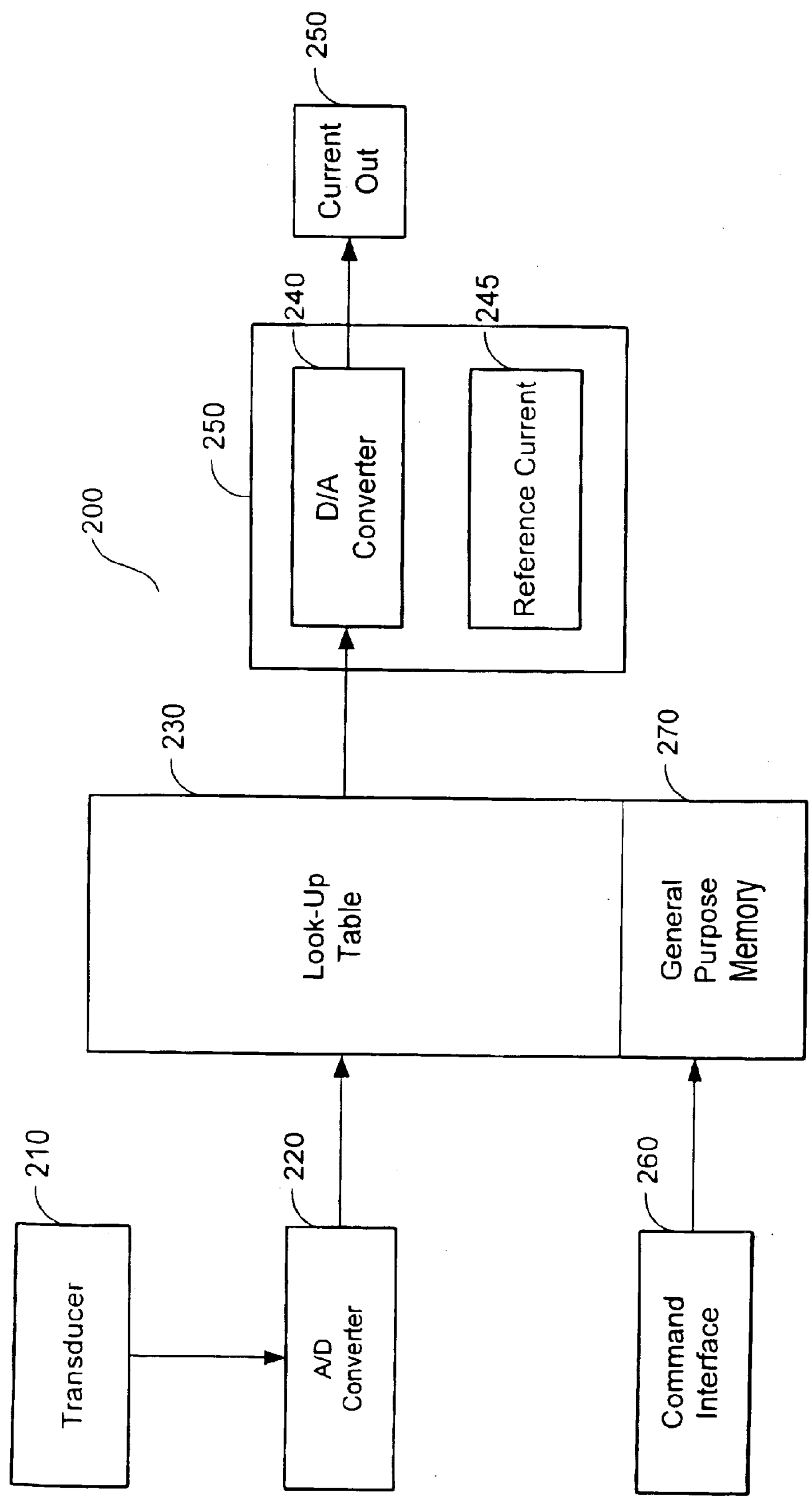
FIG. 2 is a schematic illustration of a programmable current controller according to a first implementation of the invention.

FIG. 2 discloses one implementation of a highly integrated programmable feed forward current controller (200) that includes a transducer (210), an analog-to-digital (A/D) converter (220), a programmable look-up table (230), and a digitally controlled current generator (250). Transducer (210) can be any device that is capable of converting a physical parameter such as a temperature, pressure, flow, intensity, humidity, luminosity, acidity, salinity, weight, size, density, or other physical parameter into an electrical signal. The electrical signal generated by transducer (210) can be either an analog or digital signal. Typically, the signal is an analog signal that can be subsequently digitized by A/D converter (220). Programmable look-up table (230) can be implemented in any general purpose memory such as random access memory (RAM) or non-volatile Electrically Erasable Programmable Read-Only Memory (EEPROM). Programmable look-up table (230) can be programmed with arbitrary data via a command interface (260).

The programmable current controller (200) can be used to control a drive current used to drive a device having a response that depends on both the drive current and on some physical parameter that can be measured by transducer (210). To render the response of the device independent of the physical parameter measured by transducer (210), programmable look-up table (230) can be programmed with the control currents that are necessary to produce the compensated drive currents for a given value of the physical parameter.

For example, in one implementation transducer (210) can be a temperature transducer, and programmable current controller (200) can be used to control a drive current that is used to drive a laser diode having a light output power level that depends on both the drive current supplied to the laser diode and the temperature of the laser diode. In that implementation, programmable look-up table (230) can be programmed with the control currents necessary to temperature compensate the drive current in order to drive the laser diode to output light at a constant power level regardless of temperature.

In operation, the controller maintains the laser diode light output level at a constant level, independent of temperature, as follows. At a given temperature, transducer (210) outputs a signal representative of the laser diode temperature. The transducer signal is digitized and used to select an entry in programmable look-up table (230). The look-up table is pre-programmed with the control currents, as a function of temperature, that are required to generate temperature compensated drive currents capable of driving the laser diode to output light at the constant output power level. The selected entry of look-up table (230) is delivered to a digitally controlled current generator (250) to generate a suitable control current to control the drive current delivered to the laser diode so that the laser diode light output power level will remain constant. The digitally controlled current generator (250) can be implemented as a current mode D/A converter (240) that is driven by a reference current (245).

All functions of current controller (200) can be controlled via a command interface (260) that is capable of writing data to and receiving data from a general purpose memory (270). The general purpose memory (270) can include programmable look-up table (230). Command interface (260) can be implemented as a digital serial interface, however, other implementations are possible and still within the scope of the invention. For example, command interface (260) can also be implemented as a digital parallel interface.

Figure 3:
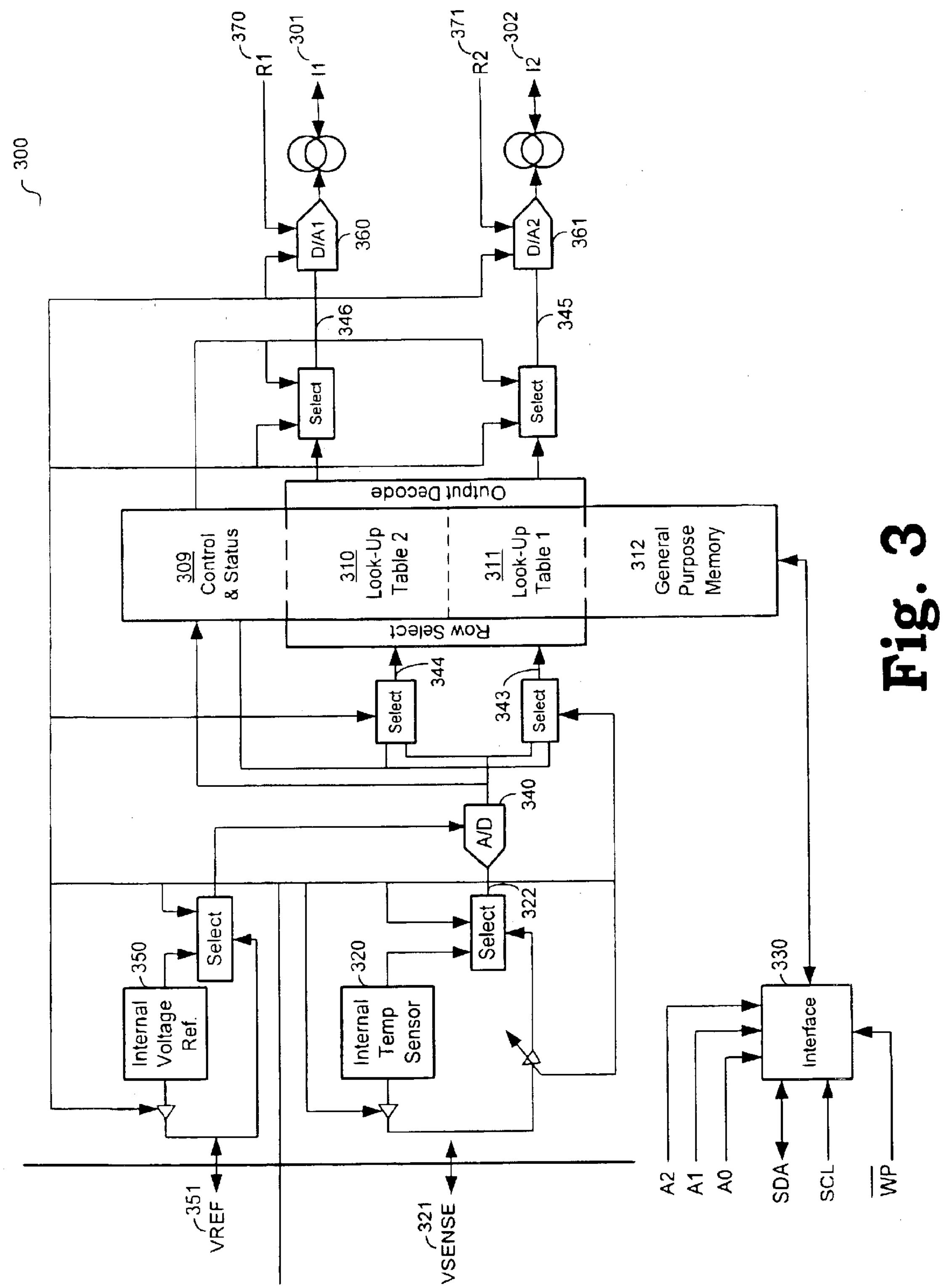
FIG. 3 is a schematic illustration of a programmable current controller according to a second implementation of the invention.

As shown in FIG. 3, in one implementation a digitally controlled current controller (300) can combine a temperature transducer (320), two programmable current generators (301) and (302), and a pair of integrated programmable look-up tables (310) and (311) in a monolithic, integrated circuit package. Current generators (301) and (302) can be used to control the bias and modulation currents used to drive a laser diode in a fiber optics module in order to compensate for variations in the laser diode's light output power level as a function of temperature. All functions of current controller (300) can be controlled via command and control interface (330), which can be implemented as a digital serial interface.

Current generators (301) and (302) can be digitally programmed with the respective contents of programmable look-up tables (310) and (311) to vary with temperature the control currents delivered by current controller (300). The temperature varied control currents can be used to control the bias and modulation currents used to drive the laser diode. Look-up tables (310) and (311) can be programmed with arbitrary data through the command and control interface (330). In particular, look-up tables (310) and (311) can be respectively programmed with the temperature dependent control currents that are necessary to produce temperature compensated bias and modulation currents that can drive the laser diode to output light at constant predetermined minimum and maximum output power levels.

Current controller (300) can be configured to utilize either an internal (320) or external (321) temperature sensor to determine the control currents output by current generators (301) and (302). The internal temperature sensor can operate over any temperature range, and typically operates over the range from −40° C. to +85° C. The output (322) from the internal or external temperature sensor can be converted to a digital signal by an A/D converter (340). The output from A/D converter (340) can be separately added to a pair of memory offsets (343) and (344), and the resulting sums can be respectively used to address entries in programmable look-up tables (310) and (311). The addressed entries of programmable look-up tables (310) and (311) can respectively contain the pre-programmed digitized control currents that are necessary to produce temperature compensated bias and modulation currents at the measured temperature. These digitized control currents can be converted into a pair of analog control currents by a respective pair of current mode D/A converters (360) and (361). The analog control currents can be used to control the bias and modulation currents used to drive the laser diode.

In one implementation A/D converter (340) is configured as a 6-bit A/D converter whose output, when added to a pair of memory offsets (343) and (344), can be used to address a respective pair of entries in each of programmable look-up tables (310) and (311). The addressed entries of look-up tables (310) and (311) can be implemented as 8-bit words containing the digitized control currents that are necessary to control the bias and modulation currents used to drive the laser diode at the measured temperature. These digitized control currents can be respectively converted into analog control currents by current mode D/A converters (360) and (361). The analog control currents will respectively take on values equal to $N_{310}*I_{ref}/16$ and $N_{311}*I_{ref}/16$, where $N_{310}$ and $N_{311}$ are the respective decimal values of the 8-bit words addressed in look-up tables (310) and (311), and where $I_{ref}$ is the reference current provided to D/A converters (360) and (361).

Current controller (300) can also include a general purpose memory (312), and control and status registers (309) that can be used to test and setup the controller. The general purpose memory (312), look-up tables (310) and (311), and control and status registers (309) can be implemented in a single EEPROM array. In one implementation, a 272 byte EEPROM array is configured so that the first 128 bytes of the array is used for the general purpose memory (312), while the next 16 bytes are used for the control and status registers (309), the next 64 bytes are used for look-up table (310), and the last 64 bytes are used for look-up table (311). The look-up tables (310) and (311) can be programmed to store the temperature dependent control currents that can be delivered by current controller (300) through current generators (301) and (302). The control and status registers (309) can be programmed to change the value of various current controller parameters that are stored in general purpose memory (312) and look-up tables (310) and (311). The control and status registers (309) can be written to and read from the control interface (330), which can be implemented as a serial interface.

In one implementation, current controller (300) is configured to have seven byte-wide control registers and one byte-wide status register. In this implementation, the first byte of the control and status register memory is occupied by control register 0 (CR0). The first two bits of CR0 can be set to inhibit write operations to certain addresses within the memory of current controller (300) to protect the data stored in those sections of memory. When the first two bits of CR0 are set to (0,0) no data in memory is protected. When they are set to (0,1) only the data in general purpose memory (312) is protected. When they are set to (1,0) only the data in general purpose memory (312) and look-up table (310) is protected. Finally, when they are set to (1,1) the data in general purpose memory (312), look-up table (310), and look-up table (311) is protected.

Figure 4A:
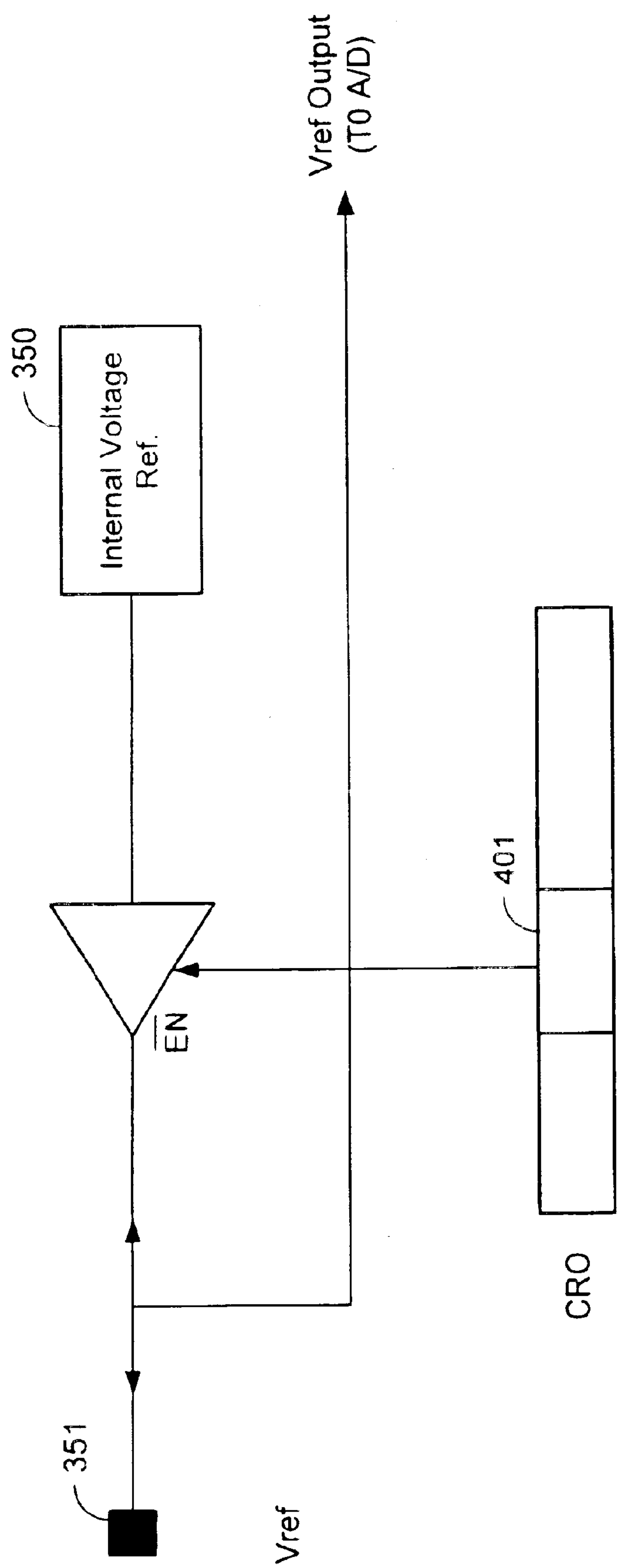
FIGS. 4A and 4B are schematic illustrations showing the control of the reference voltage source and the transducer source, respectively, in the second implementation of the invention.
Figure 4B:
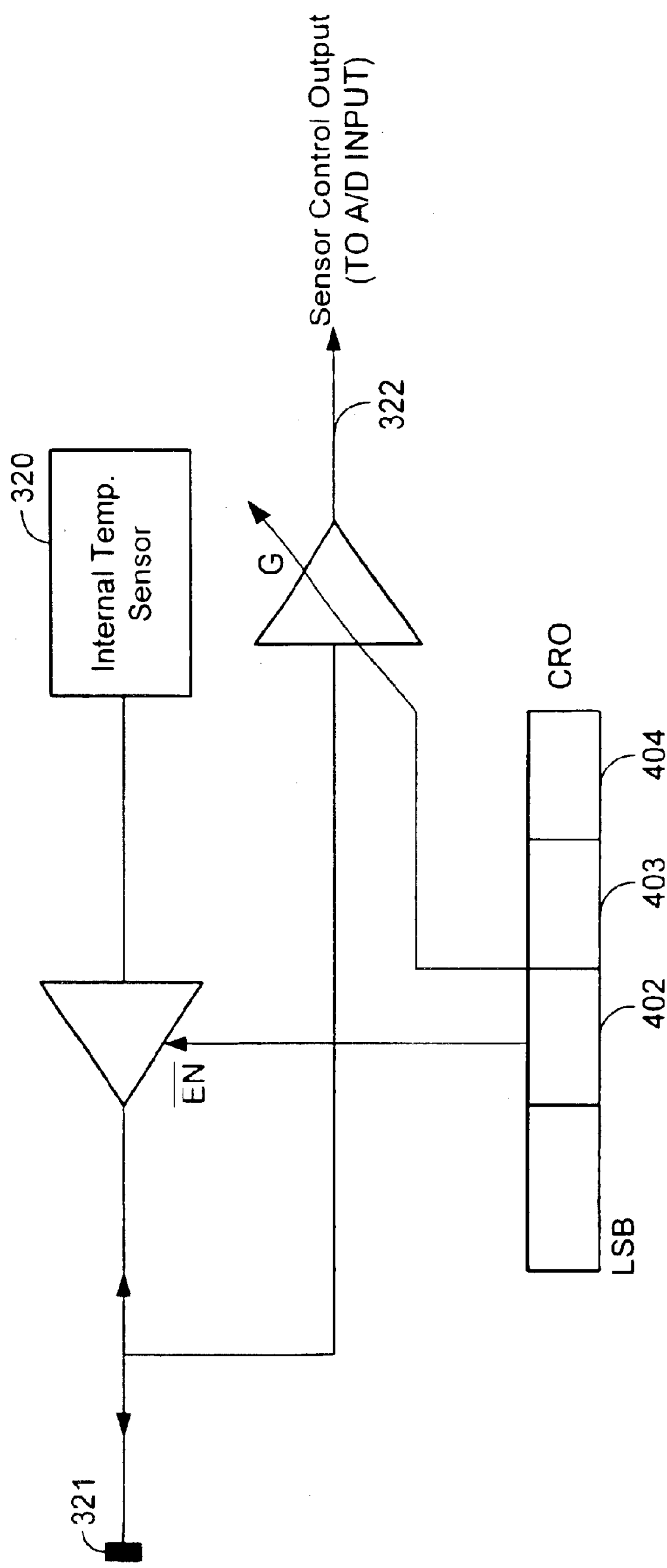

As shown in FIG. 4A, the third bit (401) of CR0 is used to configure a voltage reference pin (351) to either output an internally generated reference voltage (350) when set low (default) or to receive an external reference voltage when set high. The voltage, whether internal or external, is used by A/D converter (340) as a reference voltage. As shown in FIG. 4B, the fourth bit (402) of CR0 is used to configure a voltage sense pin (321) to either output the voltage generated by an internal temperature sensor (320) when set low (default), or to receive an external voltage reference when set high. The voltage on voltage sense pin (321), whether internally or externally generated, is digitized by A/D converter (340). When the voltage is externally generated, it can be amplified by an internal amplifier to maximize utilization of the dynamic range of A/D converter (340). The gain of the internal amplifier is controlled by the fifth (403) and sixth (404) bits of CR0 such that when these bits are set to: (0,0) the gain is set to unity; (0,1), the gain is set to 10; (1,0), the gain is set to 20; and finally, (1,1), the gain is set to 30.

Figure 6:
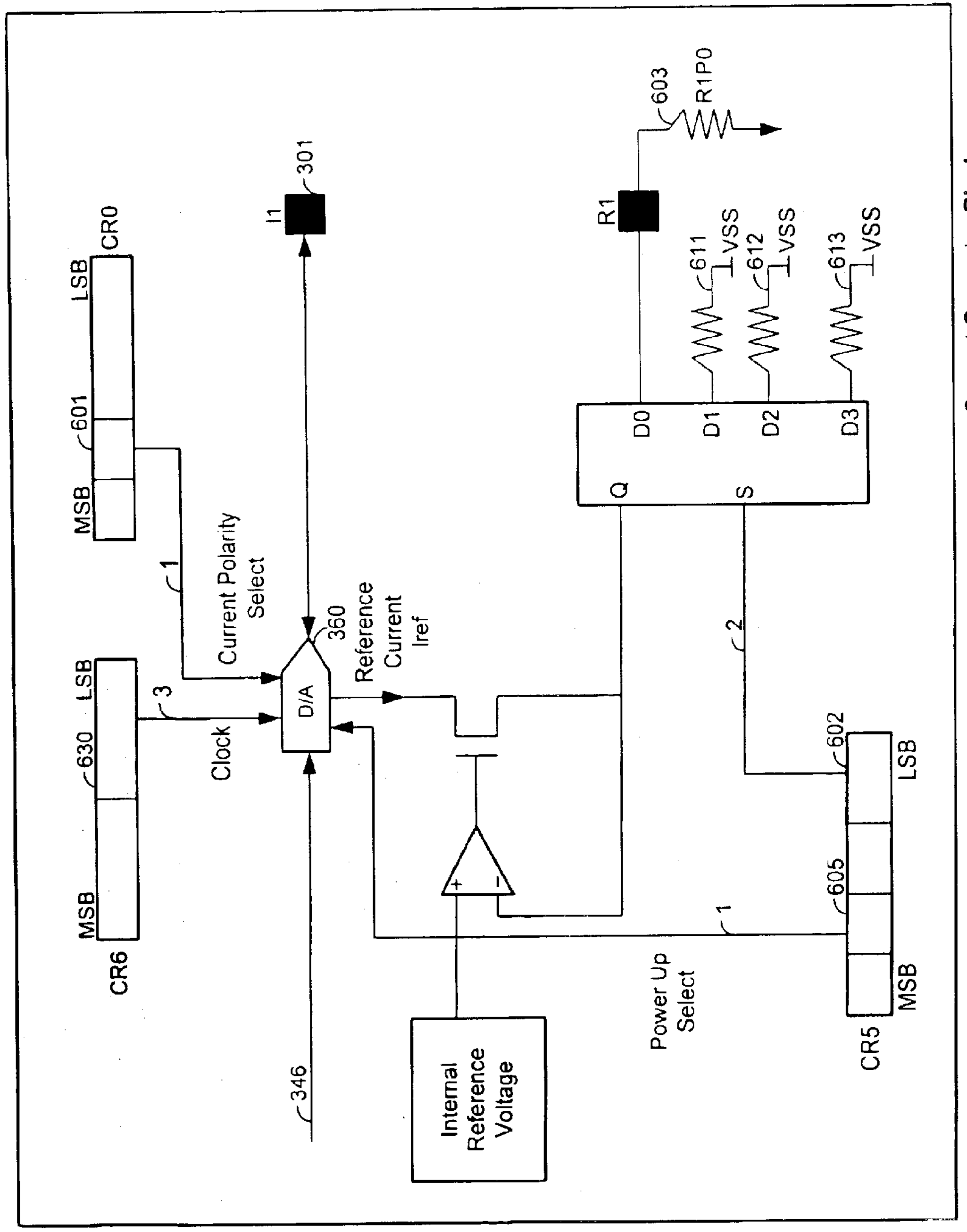
FIG. 6 is a schematic illustration of the current generators according to the second implementation of the present invention.

As shown in FIG. 6, the seventh (601) and eighth bits of CR0 are used to respectively configure current generators (301) and (302). When the seventh bit of CR0 is set low (default), current generator (301) is configured as a current source; when the seventh bit is set high, current generator (301) is configured as a current sink. Similarly, when the eighth bit of CR0 is set low (default), current generator (302) is configured as a current source; and when the eighth bit is set high, current generator (302) is configured as a current sink.

Figure 5A:
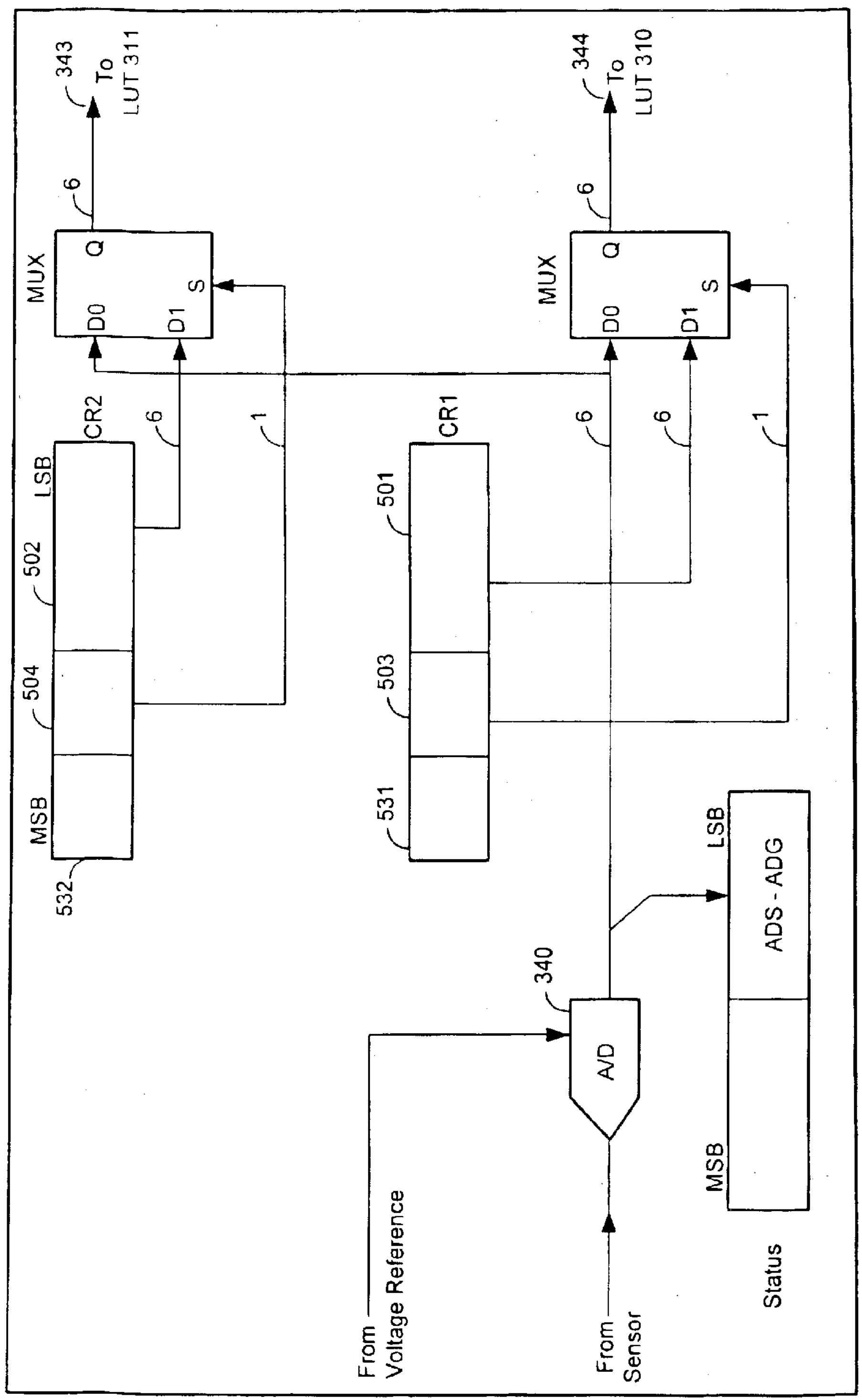
FIGS. 5A and 5B are schematic illustrations showing the control of access to data in the look-up tables according to the second implementation of the invention.

Control register 1 (CR1) occupies the second byte of control and status register (309) memory. As shown in FIG. 5A, the first six bits (501) of CR1 are used to hold a 6-bit address that can be added to the base address (342) of look-up table (310) (both shown in FIG. 5B) to access the contents of a row of the look-up table when the seventh bit (503) of CR1 is set high. When the seventh bit (503) of CR1 is set low (default), the first six bits (501) of CR1 can be ignored, and the contents of look-up table (310) can be accessed by the sum of the 6-bit output of A/D converter (340) and the base address (342) of look-up table (310).

Figure 5B:
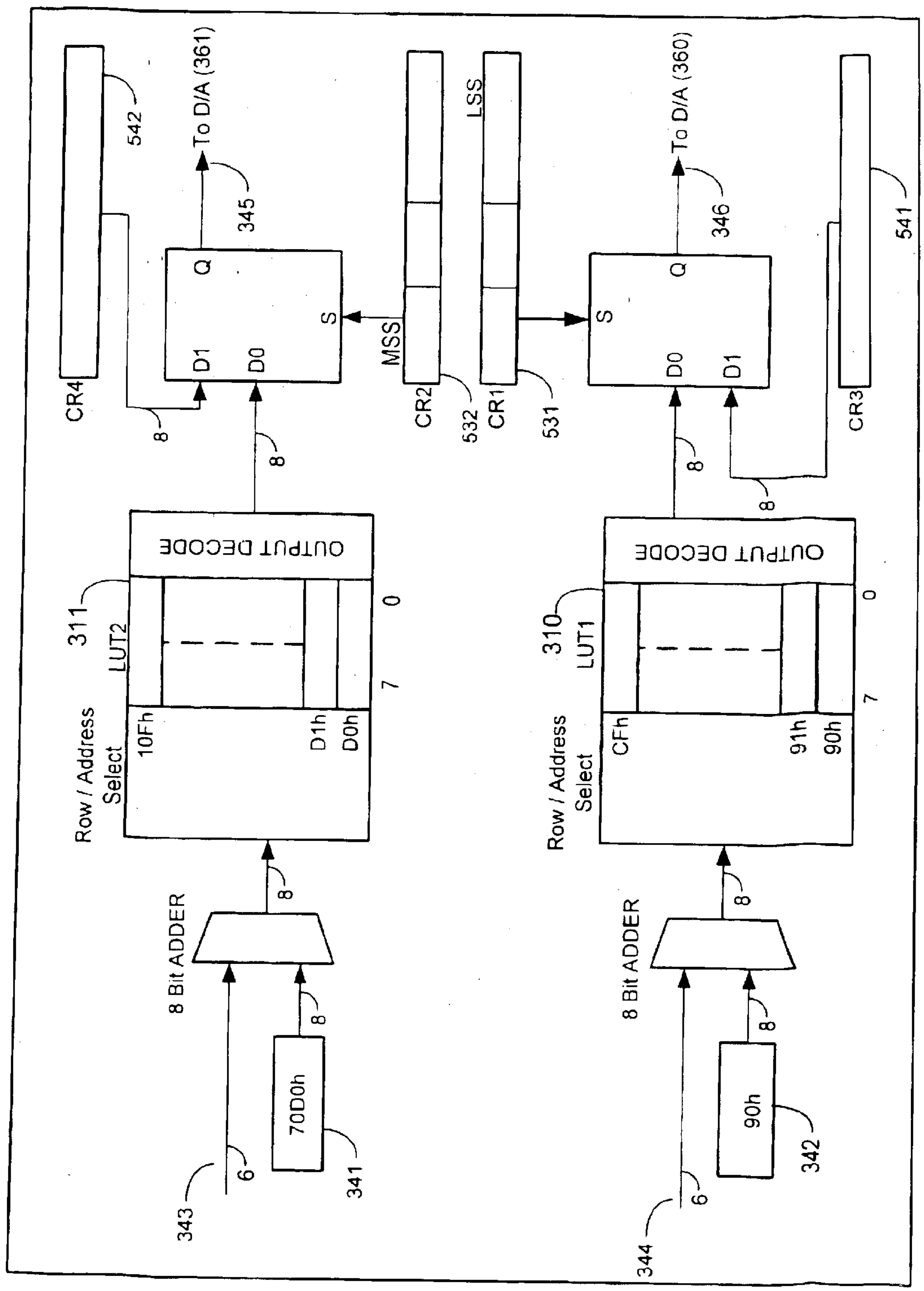

As shown in FIG. 5B, the eighth bit (531) of CR1 controls the input (346) to D/A converter (360). When the eighth bit (531) of CR1 is set low (default), the input (346) to D/A converter (360) is the addressed content of look-up table (310), where the address is supplied by either A/D converter (340) or the first six bits (501) of CR1 as previously discussed in reference to FIG. 5A. When the eighth bit (531) of CR1 is set high, the input (346) to D/A converter (360) is an 8-bit word (541) that is stored in Control Register 3 (CR3), which occupies the fourth byte of control and status register (309) memory.

Control register 2 (CR2) occupies the third byte of control and status register (309) memory and performs the same functions as CR1. Namely, as shown in FIG. 5A, the first six bits (502) of CR2 contain an address that when added to the base address (341) of look-up table (311) can be used to access a row of look-up table (311) when the seventh bit (504) of CR2 is set high. When the seventh bit (504) of CR2 is set low (default), the first six bits (502) of CR2 are ignored and the contents of look-up table (311) are accessed by the sum of the 6-bit output of A/D converter (340) and the base address (341) of look-up table (311). Similarly, as shown in FIG. 5B, the eighth bit (532) of CR2 controls the input (345) to D/A converter (361). When the eighth bit (533) of CR2 is set low (default), the input (345) to D/A converter (361) is the addressed content of the row of look-up table (311), where the address is supplied by either A/D converter (340) or the first six bits (502) of CR2 as previously discussed in reference to FIG. 5A. When the eighth bit (532) of CR2 is set high, the input (345) to D/A converter (361) is an 8-bit word (542) that is stored in Control Register 4 (CR4), which occupies the fifth byte of control and status register (309) memory.

Control register 5 (CR5) occupies the sixth byte of control and status register (309) memory and is used to control the behavior of current generators (301) and (302). As shown in FIG. 6, the first two bits (602) of CR5 can be set to determine the maximum current that can be generated by current generator (301). When the first two bits (602) of CR5 are set to (0,0) the maximum current can be set by an external reference (603). When the first two bits are set to (0,1) the maximum current can be internally set to a first value (611), which can be +/−0.55 mA. When the first two bits are set to (1,0) the maximum current can be internally set to a second value (612), which can be +/−1 mA. Finally, when the first two bits are set to (1,1), the maximum current can be internally set to a third value (613), which can be +/−1.6 mA. The third and fourth bits of CR5 are similarly used to determine the maximum current that can be generated by current generator (302).

The fifth (605) and sixth bits of CR5 are used to determine how the respective outputs of current generators (301) and (302) behave when power is initially supplied to the circuit. When the fifth (605) or sixth bit is set low (default), the selected output current of current generator (301) or (302) is immediately available upon the application of power to the circuit. When the fifth (605) or sixth bit is set high, the selected output current of current generator (301) or (302) is slowly ramped up from zero according to the respective programmable update clocks of D/A converters (360) and (361) as described below.

Control Register 6 (CR6) occupies the seventh byte of control and status register (309) memory, and is used to control the update clock rates of D/A converters (360) and (361). The first three bits (630) of CR6 can be set to control the update clock rate of D/A converter (360), while the fourth through sixth bits can be set to control the update clock rate of D/A converter (361). The update rates for D/A converters (360) and (361) can be determined by the relevant three bits according to table 1 below. In one implementation, the update rates for D/A converters (360) and (361) are programmed to different values to prevent instabilities from arising in the modulation and bias currents controlled by current controller (300) when the modulation and bias currents are controlled by a feedback circuit.

TABLE 1

| Bit 1 | Bit 2 | Bit 3 | Update Rate (us) |
|---|---|---|---|
| 0 | 0 | 0 | 80 |
| 0 | 0 | 1 | 160 |
| 0 | 1 | 0 | 320 |
| 0 | 1 | 1 | 640 |
| 1 | 0 | 0 | 1280 |
| 1 | 0 | 1 | 2560 |
| 1 | 1 | 0 | 5120 |
| 1 | 1 | 1 | 10240 |

The status register occupies the eighth byte of control and status register (309) memory. The first six bits of the status register can be set internally to hold the digital output of A/D converter (340), and can be read but not set by a user.

In operation, the programmable current controller (300) depicted in FIG. 3 can be described as follows. A user predetermines data for a pair of control currents (301) and (302) that are required to temperature compensate or control a pair of drive currents used to drive one or more devices having a temperature dependent output response. The control current compensation data are then programmed from the command interface (330) into respective look-up tables (310) and (311) of current controller (300) through control and status registers (309). The operating temperature of the device under control can then be measured through either internal temperature sensor (320) or through external sense terminal (321). The measured temperature can be digitized and added to a pair of memory offsets for look-up tables (310) and (311). The resulting sums can be used to address the control current compensation data for current generators (301) and (302), respectively, that are stored in look-up tables (310) and (311). The control current compensation data can be respectively converted to analog currents through current mode D/A converters (360) and (361). The resulting control currents (301) and (302) can then be used to control or temperature compensate a pair of currents used to drive the device or devices to which programmable current controller (300) is attached in order to remove the temperature dependence from the device or devices output response.

A number of embodiments of the invention have been described. Nevertheless, it will be understood that various modifications may be made without departing from the spirit and scope of the invention. For example, while the invention has been described as a current controller, it can also be used as a voltage controller. Also while the invention has been described as controlling a device that has a temperature dependent response, the invention can also be used to control a device having a response that is dependent on any physical variable that can be measured by a transducer and converted into an electrical signal. Examples of such physical variables include, but are not limited to, currents, voltages, resistances, pressures, flows, intensities, humidities, luminosities, acidities, salinities, weights, sizes, or densities. Finally, while the invention has been described as minimizing the dependence of the response of a device under control on the physical parameter measured by transducer (210), the invention can be used to alter the dependence of the response of the device under control on the physical parameter measured by transducer (210) in an arbitrary way. For example, the invention can be used to alter the response of a device that is naturally linearly dependent on temperature so that the response of the device is quadratically dependent on temperature, or exponentially dependent on temperature. Accordingly, these and other embodiments are within the scope of the following claims.

What is claimed is:

1. A programmable bias controller, comprising a monolithic integrated circuit having a feed forward programmable current supply, wherein the monolithic integrated circuit further comprises a feed forward compensation circuit to drive the feed forward programmable current supply, and wherein the monolithic integrated circuit further comprises a programmable look-up table configured to store data used to program the feed forward programmable current supply.

2. The controller of claim 1, wherein the programmable look-up table comprises non-volatile memory elements.

3. The controller of claim 2, wherein the non-volatile memory elements comprise EEPROM memory elements.

4. The controller of claim 1, wherein the monolithic integrated circuit further comprises means for programming control current compensation data into the programmable look-up table.

5. The controller of claim 4, wherein the means for programming the programmable look-up table comprise a serial interface.

6. The controller of claim 1, wherein the monolithic integrated circuit further comprises a transducer having an output signal corresponding to an entry in the programmable look-up table.

7. The controller of claim 6, wherein the transducer is a device that is capable of converting a physical parameter into an electrical signal.

8. The controller of claim 7, wherein the transducer is a device that is capable of producing an electrical signal that is representative of a physical parameter chose from the group consisting of temperature, pressure, flow intensity, humidity, luminosity, acidity, salinity, resistance, current, voltage, weight, size, and density.

9. The controller of claim 7, wherein the monolithic integrated circuit further comprises an analog-to-digital converter coupled between the transducer and the programmable look-up table, wherein the analog-to-digital converter is configured to convert the electrical signal output by the transducer to a digital signal that can select an entry in the programmable look-up table.

10. A programmable bias controller comprising:

a transducer capable of converting a physical parameter into a digital signal;

a programmable look-up table coupled to and addressable by the digital output of the transducer, wherein the programmable look-up table is configured to store control current data for a programmable current source; and a programmable current source coupled to the programmable look-up table;

wherein the transducer, the programmable look-up table, and the programmable current source are integrally formed in a monolithic integrated circuit.

11. The programmable bias controller of claim 10, wherein the transducer capable of converting a physical parameter into a digital signal further comprises:

a transducer capable of converting a physical parameter into an analog signal; and an analog-to-digital converter.

12. A laser diode current controller comprising:

a temperature sensing circuit having a digital output;

first and second control current look-up tables coupled to and addressable by the digital output of the temperature sensing circuit, wherein the first and second control current look-up tables are respectively configured to store control current data to control or temperature compensate laser diode bias and modulation currents; and first and second programmable current sources, wherein the first and second programmable current sources are respectively operable to control or temperature compensate the bias and modulation currents used to drive the laser diode;

wherein the temperature sensing circuit, the first and second control current look-up tables, and the first and second programmable current sources are integrally formed in a monolithic integrated circuit.

13. The controller of claim 12, wherein the temperature sensing circuit is selectably an internal temperature sensing circuit or an external temperature sensing circuit.

14. The controller of claim 12, wherein the temperature sensing circuit comprises an analog temperature transducer operable to output an analog signal corresponding to a temperature, and an analog-to-digital converter operable to convert the analog output signal to a digital output signal.

15. The controller of claim 12, wherein the monolithic integrated circuit further comprises first and second digital-to-analog converters respectively coupled between the first and second control current look-up tables and the first and second programmable current sources, and wherein the first and second digital-to-analog converters are respectively configured to convert the digital outputs of the first and second control current look-up tables into analog outputs to respectively program the firs and second programmable current sources.

16. The controller of claim 15, wherein the update rates of the first and second digital-to-analog converters are independently programmable.

17. The controller of claim 12, wherein the first and second programmable current sources are temperature compensated.

18. The controller of claim 12, wherein the first and second control current look-up tables comprise non-volatile memory elements.

19. The controller of claim 18, wherein the non-volatile memory elements are EEPROM memory elements.

20. The controller of claim 12, wherein the first and second control current look-up tables are programmable.

21. The controller of claim 20, further comprising means for programming the first and second control current look-up tables.

22. The controller of claim 21, wherein the means for programming the first and second control current look-up tables comprise a serial interface.

23. A method for maintaining the power output of a laser diode at a plurality of predetermined power levels, comprising:

measuring the temperature of the laser diode;

determining the feed forward control currents necessary to temperature compensate the bias and modulation currents used to drive the laser diode; and using the control currents to control the bias and modulation currents to maintain the laser diode power output at the predetermined power levels.

24. A method for controlling a drive current used to drive a device having a response that depends on a physical parameter, comprising:

measuring the physical parameter on which the response of the device depends;

using the measured physical parameter to determine a feed forward control current to control the drive current used to drive the device; and using the feed forward control current to control the drive current to compensate for the dependence of the device's response on the physical parameter.

25. A laser diode current controller comprising:

a temperature sensor circuit;

a first lookup table coupled to an output of the temperature sensor circuit;

a second lookup table coupled to the output of the temperature sensor circuit;

a first programmable current source coupled the first lookup table; and a second programmable current source coupled to the second lookup table.

26. The laser diode current controller of claim 25 wherein the first lookup table, second lookup table, first programmable current source, and second programmable current source are formed on an integrated circuit.

27. The laser diode current controller of claim 25 wherein the temperature sensor circuit, first lookup table, second lookup table, first programmable current source, and second programmable current source are formed on an integrated circuit.

28. The laser diode current controller of claim 25 wherein temperature sensor circuit comprises a transducer coupled to an analog-to-digital converter.

29. The laser diode current controller of claim 28 wherein an output of the analog-to-digital controller is coupled to address entries in the first and second lookup table.

30. The laser diode current controller of claim 29 wherein the first programmable current source includes a first digital-to-analog converter coupled to the first lookup table and the second programmable current source includes a second digital-to-analog converter coupled to the second lookup table.

31. The laser diode current controller of claim 30 wherein the first digital-to-analog converter is coupled to receive entries from tile first lookup table and the second digital-to-analog converter is coupled to receive entries from the second lookup table.

32. An integrated circuit comprising:

an analog-to digital converter configured to receive an analog signal corresponding to a temperature;

a first lookup table configured to receive an output from the analog-to-digital converter;

a second lookup table configured to receive the output from the analog-to-digital converter;

a first digital-to-analog converter configured to receive entries from the first lookup table;

a second digital-to-analog converter configured to receive entries from the second lookup table;

a first current source configured to receive an output from the first digital-to-analog converter and provide a first current; and a second current source configured to receive an output from the second digital-to-analog converter and provide a second current.

33. The integrated circuit of claim 32 further comprising a temperature transducer configured to provide the analog signal corresponding to temperature.

34. The integrated circuit of claim 33 wherein the first lookup table and second lookup table are nonvolatile memories.

35. The integrated circuit of claim 34 wherein the nonvolatile memories are EEPROM memories.

* * * * *